(12) United States Patent
Belmore et al.

(10) Patent No.: US 6,294,908 B1
(45) Date of Patent: Sep. 25, 2001

(54) TOP AND BOTTOM ACCESS FUNCTIONAL TEST FIXTURE

(75) Inventors: Walter Joseph Belmore, Spring; Dustin Vu, Houston, both of TX (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/116,774

(22) Filed: Jul. 16, 1998

(51) Int. Cl.[7] .................................................. G01R 31/02
(52) U.S. Cl. ........................ 324/158.1; 324/754; 324/758
(58) Field of Search ................................ 324/158.1, 754, 324/755, 761, 758, 73

(56) References Cited

U.S. PATENT DOCUMENTS

| | | | |
|---|---|---|---|
| 4,357,062 | * | 11/1982 | Everett ..................................... 324/73 |
| 5,087,878 | * | 2/1992 | Belmore, III et al. ............ 324/158.1 |
| 5,270,641 | * | 12/1993 | Van Loan et al. ................. 324/158.1 |
| 5,500,606 | * | 3/1996 | Holmes ................................. 324/761 |
| 5,898,313 | * | 4/1999 | Cugini ................................... 324/758 |

* cited by examiner

Primary Examiner—Safet Metjahic
Assistant Examiner—Jimmy Nguyen
(74) Attorney, Agent, or Firm—Conley, Rose & Tayon, P.C.

(57) ABSTRACT

A computer system is provided for testing components within the system. A closely coupled dual-access fixture is used for electrically interfacing a first side and a second side of a PCB under test. The fixture has a first interface for electrically interfacing the fixture with a first set of test pads on the first side of the PCB under test. The fixture also includes a second interface for electrically interfacing the fixture with a second set of test pads on the side of the PCB under test opposite the first side. Both interfaces include an interface PCB (IPCB). Each IPCB has at least one connector corresponding to a connector on the PCB under test. Each of the connectors on the PCB under test has test pads on the side opposite the connector. Sets of test pins are used to electrically connect the connector of the PCB under test to the respective IPCB so that a PC card placed in the connector of the IPCB will interface with the PCB under test as if the PC card were placed in the connector of the PCB under test. This arrangement allows the test PC cards to remain in close proximity to the PCB under test and eliminates latencies and noise that can interfere with testing. Once interfaced with the fixtures, the PCB under test becomes an integral part of a test computer system so that the PCB under test can be tested under operating conditions.

24 Claims, 10 Drawing Sheets

TOP AND BOTTOM ACCESS FUNCTIONAL TEST FIXTURE

BACKGROUND OF THE INVENTION

1. Field of the Invention

The present invention relates to dual-access test fixtures. More particularly, the present invention relates to dual-access test fixtures for testing printed circuit boards without requiring the insertion or the removal of peripheral PC cards to or from socket connectors.

2. Description of the Related Technology

A test fixture is an apparatus designed for mounting and interfacing a printed circuit board (PCB) to be tested by a test and analysis apparatus, otherwise referred to as a board tester. In general, there are two basic types of testers, in-circuit testers for identifying or verifying electrical shorts, open-circuits, component tolerances and IC chip "clocking," and functional testers for verifying the appropriate functional operation of the PCB. An example of an in-circuit tester is the GENRAD 2272/2282 board tester. The present invention, however, is primarily concerned with fixtures for testing the functional operation of PCBs.

The purpose of a dual-access test fixture is to access test points or pads simultaneously on the top and bottom sides of the PCB under test. As the size of PCBs get smaller and become more densely populated with components, the test pads on the PCB consequently decrease in size. These smaller test pads require greater accuracy and much tighter tolerances of the fixture apparatus, since otherwise good PCBs would fail because of misalignment of the probes or pins with the test pads for electrical interfacing. Furthermore, as the PCBs under test become more sophisticated, it is desirable and often necessary to test separate circuits on the bottom and top sides of the PCB. Several dual-access test fixtures have been implemented to solve some of the ever-increasing alignment problems, but many alignment problems still exist, especially due to the advent of smaller test pads.

The existing test fixtures have several deficiencies causing an inordinate percentages of failures. One major problem is the use of electrical wires in one form or another to complete electrical connections. The wires are typically in the form of cable harnesses, where long, individual wires are used for each test connection, or ribbon cable coupled between the top and bottom fixtures and mounted to corresponding connectors.

Many false signal and noise problems arose when using wire or ribbon cables to electrically connect test pins used to contact the test pads of the PCB under test. The wires add stray capacitance or inductively couple signals in nearby test wires, causing electrical noise and false signals. This problem has not been previously solved, so that the only method to achieve an accurate test on a high speed PCB was to reduce the frequency of the test. Frequency reduction is undesirable, since the test is not completely reliable at slower speeds. The most accurate and reliable test is performed at the true clock frequency.

U.S. Pat. No. 5,157,325 ('325), issued Oct. 20, 1992 to Murphy, discloses an existing version of "wireless" fixture technology, which is hereby incorporated by reference. In the so-called wireless technology of the '325 patent, specially designed test probes comprising doubled-ended pogo pins were mounted to a probe plate, where one side of the test pins would electrically contact or engage the test pads of the PCB under test, and where the opposite end of the test pins would electrically engage test pads on the surface of an interface PCB (IPCB). Two probe plates, each mounted with pogo pins, were provided on either side of the PCB under test. The other ends of the pogo or test pins on the bottom probe plate would electrically engage test pads on a bottom IPCB. The bottom IPCB also had rows of input/output (I/O) pads on its bottom side to electrically interface with I/O pins of the tester unit itself. Corresponding test pads formed on the upper and lower surfaces of the bottom IPCB were electrically connected together through conductive traces on and within the bottom IPCB. Thus, electrical connections were made between the test pads located on the bottom side of the PCB under test and the tester through the pogo pins on the bottom probe plate and the bottom IPCB.

On the top side of the PCB under test, the top probe plate was mounted with similar double-ended pogo pins, which were used in a similar manner to electrically engage test pads on the top side of the PCB under test to corresponding test pads on a top IPCB. The test pads on the top IPCB were electrically connected to a connector mounted on the top IPCB using routed traces on the top IPCB. One end of a ribbon cable was plugged into the connector, and the other end of the ribbon cable was plugged into a similar connector mounted on the bottom IPCB. The test fixture apparatus of the patent '325 was not a true wireless system due to the use of the ribbon cable. The ribbon cable also caused other problems. For example, when closing the fixture for testing, the ribbon cable would often get caught between the top and bottom frames, and would consequently break and need replacement. Worse yet, the internal wires would often be severed, resulting in a hidden defect which was very difficult to detect. Further, breakage of the ribbon cable sometimes caused additional electrical shorts.

The previous dual-access wireless fixture described in the '325 patent used a handler having a separate top access "cassette" containing the top fixture assembly, and a separate bottom frame containing the bottom fixture assembly. The handler caused severe alignment problems resulting in an inordinate number of failures, damage to the PCB under test and also damage to the fixture itself. In particular, when using the old handler in the dual-access application, the top cassette was able to shift or slide relative to the bottom frame before vacuum was applied, causing misalignment and broken test probes. Although guide pins and bushings were used, they were not pre-aligned before vacuum was applied. When vacuum was applied, the top access cassette was forced into alignment while the test pins were in contact with the test pads of the PCB. Such forced shifting and alignment reduced the lifetime of the guide pins and bushings, and the test pins and test pads. Several adjustments and test cycles were likely for each test, resulting in greater test cycle times. The necessary adjustments sometimes involved manually shifting the upper cassette to force alignment, often resulting in damage to the PCB under test, the test pins or other parts of the fixture.

U.S. Pat. No. 5,500,606 ('606), issued on Mar. 19, 1996 to Holmes, incorporated herein by reference for all purposes, discloses a wireless dual-access test fixture. The Holmes test fixture has added features that ensure proper alignment of the PCB under test relative to the bottom of the test fixture. In Holmes, the top access or top fixture comprises a top IPCB, an alignment plate, a spacer plate and a top probe plate mounted with the same or similar double-ended pogo pins as used in other wireless techniques. The top probe plate includes a first set of test pins, having first ends which are aligned to electrically engage the printed circuit board (PCB) under test when a vacuum is applied. The other ends of the top probe plate test pins are aligned to electrically engage test pads located on the top IPCB. The top probe plate also includes a second set of pogo pins, called transfer pins, having one end for electrically engaging transfer pads located on the top IPCB. The top IPCB is routed with electrical traces to connect the test pads to the transfer pads of the top IPCB.

The '606 patent also discloses a bottom fixture that includes a bottom IPCB, an alignment plate and a bottom probe plate mounted together. One side of the bottom IPCB includes input/output (I/O) pads for electrically engaging the I/O pins of the tester apparatus. The other side of the bottom IPCB includes test pads for electrically interfacing with the test pads on the bottom side of the PCB under test, and transfer pads for electrically interfacing with the test pads on the top of the PCB under test through transfer pins. The bottom probe plate includes a first set of test pins, each having one end for electrically engaging the test pads on the bottom IPCB, and another end for electrically engaging corresponding test pads located on the bottom side of the PCB under test. The bottom probe plate also includes a second set of pogo pins, or transfer pins, or test pins, each having one end for electrically engaging the transfer pads on the bottom IPCB, and another end for electrically engaging the transfer pins of the top probe plate. According to Holmes, all of the test pads on the top and bottom side of the PCB under test are electrically interfaced through the test pins, transfer pins and top and bottom IPCB's to the I/O pins of the tester without the use of wires. This substantially reduces false signals due to stray capacitance or inductive coupling, allowing the test to be performed at higher frequencies. Furthermore, since the tests are more accurate, a significant increase in the percentage of good PCBs that pass is achieved.

Another major problem in the art is the failure of the PCB before, during, or after "functional" testing. PCBs normally undergo three main stages of testing: continuity, functional and final. The first test is the continuity test. Continuity testing merely checks to see that there are no "shorts" or other types of mistakes that may damage other parts of the PCB or the test equipment used during subsequent testing. The second test is the functional test wherein electrical signals are input into the PCB and measurements taken to see that the output is consistent with the input. Final testing comes after all of the components are inserted into the PCB and ensures that the customer gets a quality product that is fully operative.

During the functional test, a PCB is placed on a jig and various test cards (such as I/O and memory cards) are inserted into the connector slots. The test cards are tested beforehand and are known function correctly. By using the known functional test cards, any incorrect output responses can be attributed to the PCB under test. After the functional test is complete, the test cards are removed from the PCB and used for subsequent functional tests on other PCBs. Other cards are then inserted into the PCB's connector slots per customer specifications. Unfortunately, the process of inserting and removing cards from connector slots can break or damage the connectors, causing an otherwise good PCB to fail.

It is desirable, therefore, to provide a dual access fixture without signal degrading long wires and provide functional testing without the insertion or removal of test cards. Eliminating the test card insertion/removal process would speed the testing process, reduce stress and breakage of the connector slots, which would improve the reliability of the product. Elimination of the test card insertion/removal process would eliminate the need for a skilled technician to perform the test and enable a less skilled worker to perform the same task.

SUMMARY OF THE INVENTION

The present invention overcomes the above-identified problems as well as other shortcomings and deficiencies of existing technologies by encapsulating the PCB under test in a fixture that incorporates closely coupled components to from a complete computer system.

The present invention provides a fixture for testing PCBs. The A wireless dual-access fixture contains a hinged lid covering a space where the PCB under test is placed. The lid is closed and a valve is opened to evacuate the air from test chamber. The resultant vacuum causes test pins to extend from above and below the PCB under test and connect test pads on the PCB under test to other computer system components. Alternatively, the test pins can be spring loaded to ensure that the pins remain in an extended position.

The other computer system components are mounted on two interface PCBs that lie above and below the PCB under test in the fixture. Once the test pins establish an electrical connection between the PCB under test and the interface PCBs, the central processing unit of the test computer system is booted up and the PCB under test is utilized as one of the integral components of the test computer system. Any errors or anomalies present in the test computer system can be attributed to the PCB under test because the other components are of know functionality.

The arrangement of components of the present invention allows the test PC cards to remain in close proximity to the PCB under test and eliminates signal transmission latencies and noise that can interfere with testing. The close coupling of the PCB under test with the test PC cards enables the functional testing of the PCB at operations clock frequencies. This feature will become more important in the near future as I/O bus speeds and motherboard clock frequencies are increased. Alternate embodiments of the present invention utilize transceivers in lieu of the close coupling of the known functional components. The transceivers operate at the same speed as standard system signals, and allow the other components of the test computer system to be located farther away from the PCB under test. In yet another alternate embodiment, the transceivers are multiplexed, thereby allowing their connected components to be used to test multiple PCBs concurrently.

Other and further features and advantages will be apparent from the following description of presently preferred embodiments of the invention, given for the purpose of disclosure and taken in conjunction with the accompanying drawings.

DETAILED DESCRIPTION OF THE PREFERRED EMBODIMENTS

Figure 1:
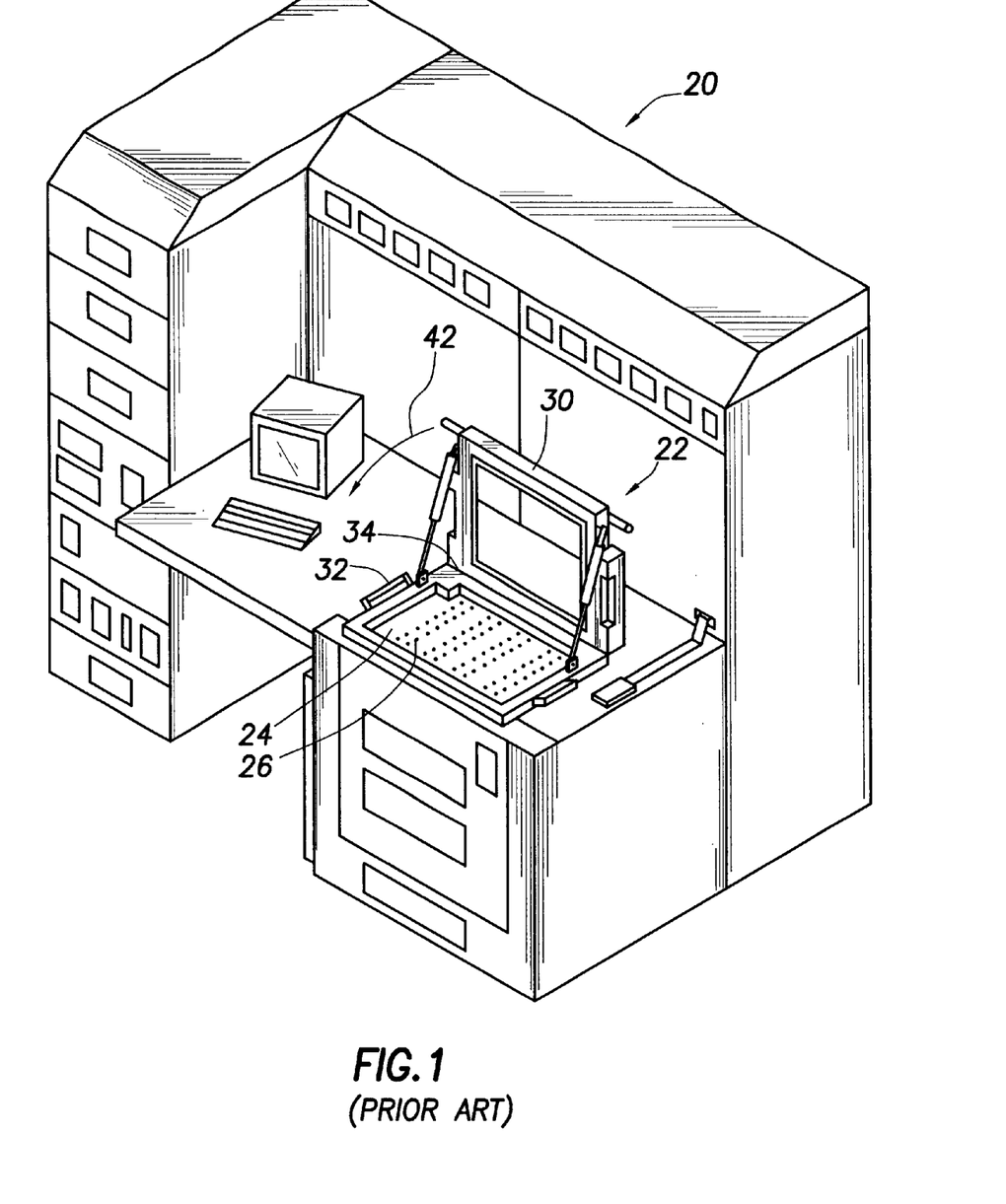
FIG. 1 shows a perspective view of a tester equipped with the handler unit of the prior art.

FIG. 1 shows a tester 20 mounted with a dual-access wireless fixture handler 22 according to prior art. The tester 20 is preferably the GENRAD 2272/2282 in-circuit tester. For example, the tester 20 includes a horizontal interface area 24. The present invention, which is a functional tester, can itself be incorporated into an in-circuit tester.

The handler 22 is mounted to the tester 20 using mounting means (not shown) as known to those skilled in the art, such as rail guides and screws or bolts. The handler 22 mounts to the tester 20 around a horizontal interface area 24 for electrically interfacing the tester 20 to the test fixture and printed circuit board (PCB) under test 36. The horizontal interface area 24 includes a plurality of upwardly projecting input/output (I/O) pins 26, typically aligned in rows or columns. The I/O pins 26 are preferably spring-loaded for sufficient electrical contact as known to those of ordinary skill in the art of test fixtures.

The handler 22 comprises a top access 30 mounted to a bottom frame 32 having a common axis 34 to open and close the fixture assembly. In general, a top fixture assembly 38 (FIG. 3a) is mounted within the top access 30 and a bottom fixture assembly 40 is mounted within the bottom frame 32. The PCB under test 36 is mounted to the bottom fixture assembly 40. The top access 30 is then lowered in the direction of an arrow 42, pivoting downwards to sandwich the PCB under test 36 between the bottom fixture assembly 40 and the top fixture assembly 38. The tester 20 includes a vacuum-operated actuation system (not shown) which forces the top fixture assembly 38 and bottom fixture assembly 40 to electrically engage the PCB under test 36, and to electrically engage the I/O pins 26 of the tester 20. The force applied may be direct through suction or vacuum between the top and bottom assemblies, or indirect by vertically moving presser bar members (not shown) to mechanically affect engagement between the PCB under test 36 and the tester 20.

Figure 2A:
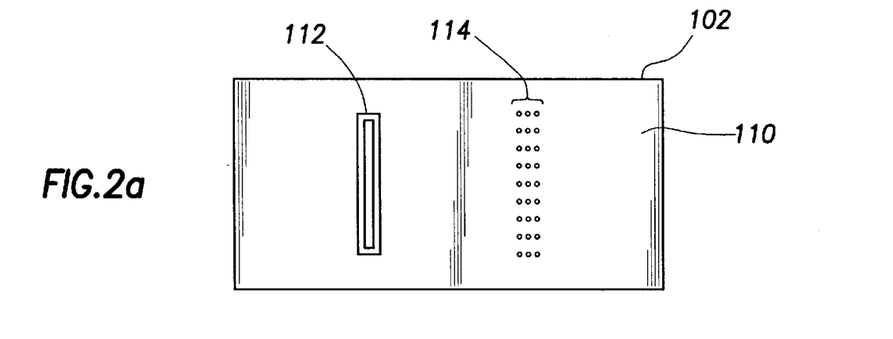
FIG. 2a shows a top view of a PCB under test of the present invention.
Figure 2B:
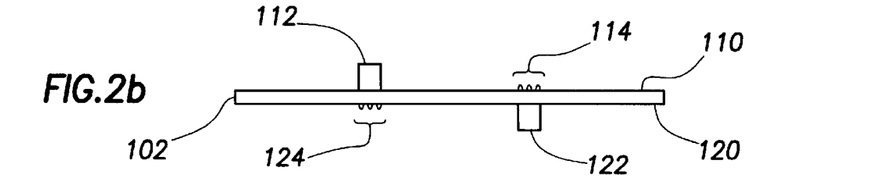
FIG. 2b shows a side view of a PCB under test of the present invention.
Figure 2C:
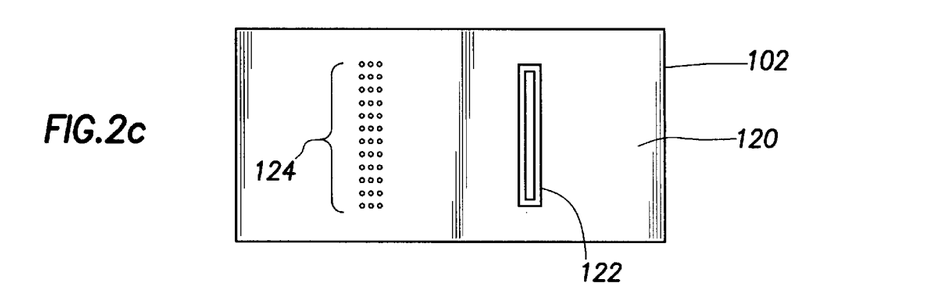
FIG. 2c shows a bottom view of a PCB under test of the present invention.

A simplified PCB to be tested with the present invention is illustrated in FIGS. 2a–c. A first (top) side of a PCB 102 under test is shown in FIG. 2a where the first connector 112 is on the left. The second connector 122 (FIG. 2c) is located to the right of the first connector 112 on the second (bottom) side of the PCB 102. Arrays of test pads (124 and 114) are located on the side opposite their respective connectors (112 and 122) as shown in FIGS. 2a–c. For example, the set (array) of test pads 124 are connected to the first connector 112 of the PCB 102. The test pads enable signals to be transmitted to, and received from, PC card that is inserted into the connector.

Figure 3A:
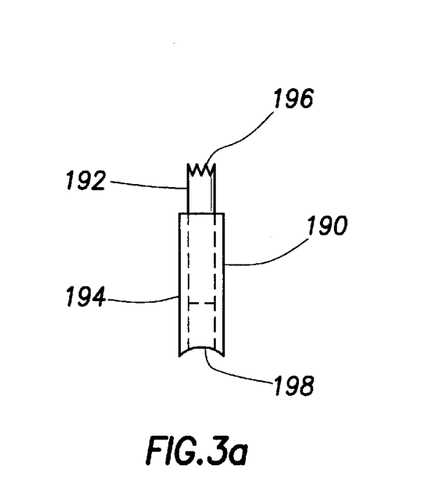
FIG. 3a shows a side view of a test pin of the present invention in a extracted position.
Figure 3B:
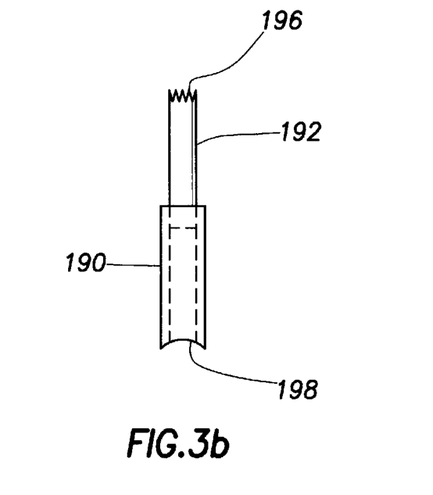
FIG. 3b shows a side view of a test pin of the present invention in an extended position.

FIGS. 3a–b shows a side view of the typical connector pin that is used to establish an electrical connection between the interface (described herein below) of the present invention and the PCB 102. The test pin 190 has two components in a telescoping relationship. Probe 192 is slideably inserted into barrel 194 so that probe 192 may be extended (as shown in FIG. 3b) or retracted (as shown in FIG. 3a). In the preferred embodiment of the present invention, the head 196 of the probe 192 has serrated teeth as shown in FIG. 3; In alternate embodiments of the present invention, the head 196 can be flat, convex, or concave, depending upon the shape of the test pads to which the test pin 190 must be electrically connected. The concave base 198 of the test pin is intended to be permanently attached to an interface PCB (described later). The test pin 190 is constructed and arranged so that, when a vacuum is applied at the head 196 of the test pin 190, the probe 192 extends. Similarly, when the vacuum at the head 196 is removed, the probe 192 retracts into barrel 194. An alternative method of extending the probe 192 would be to use a spring (not shown) that is constructed and arranged to extend the probe 192 as much as possible.

Figure 4A:
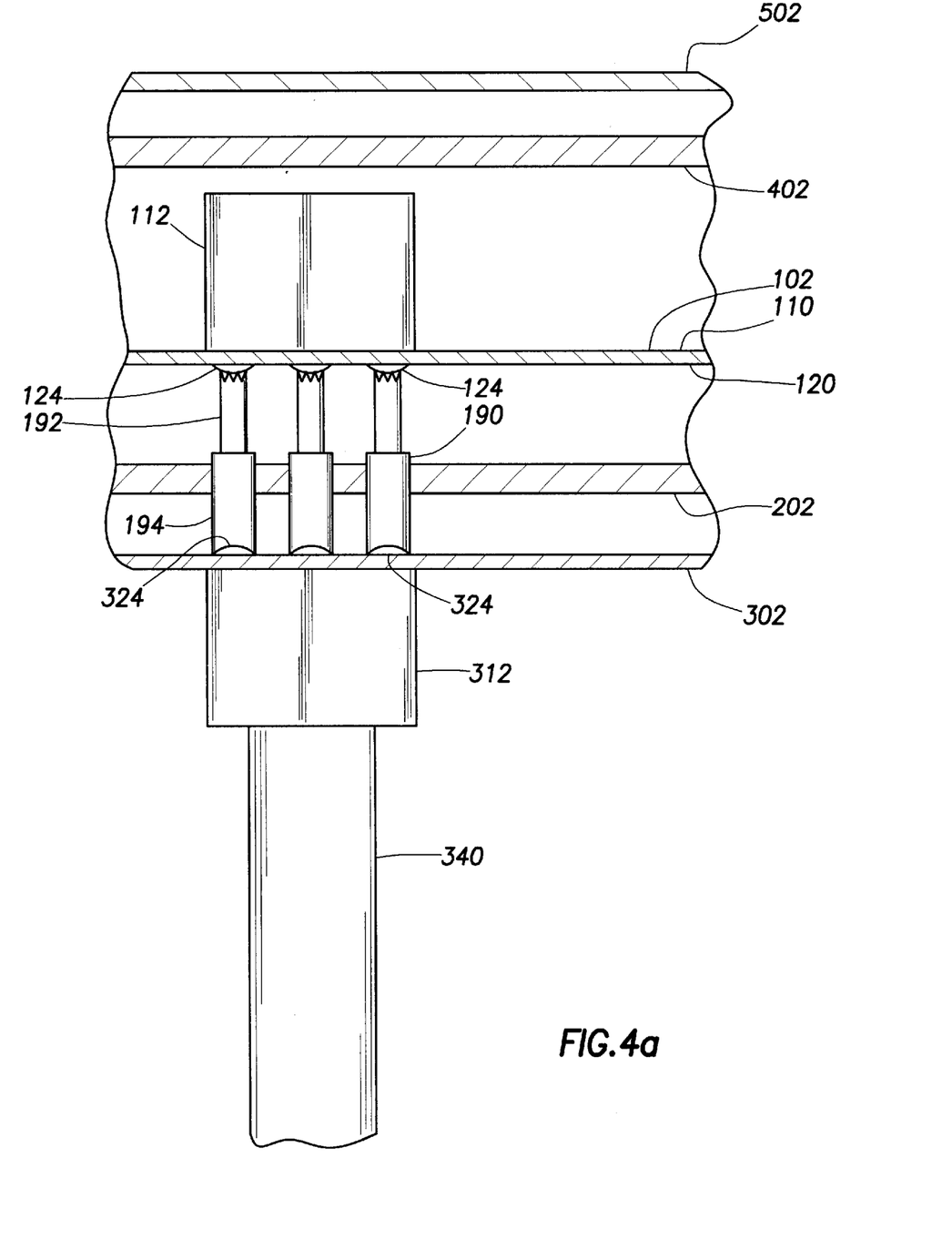
FIG. 4a shows a side view of the preferred embodiment of the present invention illustrating the close coupling between the PCB under test and an interface PCB.

FIG. 4a shows a side view of a portion of one of the interfaces of the preferred embodiment of the present invention. Note the close coupling of the PCB 102 under test and the test PC card 340. This close coupling reduces signal propagation latencies and allows actual system functional testing of the PCB 102. The reduction of signal propagation latencies is vitally important to the art. Clock speeds of central processing units have long exceeded those of the motherboards and input-output busses. Manufacturers of computer systems and components have worked feverishly to increase the clock speed of their respective devices. For example, motherboards now commonly operate at 100 MHz and PCI devices will soon operate at 133 MHz. With clock speeds of current CPUs running at 400+ MHz, the need for even higher clock speeds from peripheral devices will only increase.

Signal propagation latencies are introduced by the use if wires to convey electrical signals over distances. The wires introduce inductance, resistance and capacitance effects on the signal itself. The longer the wire (i.e. the less closely coupled the devices) the greater the signal propagation latencies. Signal propagation latencies have the effect of "rounding" the edges of the digital signals and, when running at high clock speeds, introducing errors. If close coupling between components cannot be had, then the clock speeds for the respective devices will be limited. If test fixtures cannot maintain close coupling with the test components, the computer system cannot be tested under operational (high speed) conditions. Components on the PCB 102 may include ASICs that exhibit failure only at high operating speeds. In some instances, a PCB that passes a high latency (i.e. slow speed) test may fail in normal (high speed) operation. Close coupling of the test components is, therefore, essential for mass production (and mass testing) of high speed computer systems.

Referring now to FIG. 4a, the PCB 102 under test is sandwiched between a bottom vacuum plate 202 and a top vacuum plate 402. The vacuum plates are used to help generate a vacuum between the two plates 202 and 402 around the PCB 102 under test. The PCB 102 under test has a connector 112 with a corresponding set of test pads 124 (see FIG. 2). The test pads 124 are nothing more that the through-hole PCB solder pads of the connector 112. The use of the through-hold PCB solder pads as test pads is new to the art.

Below the bottom test plate 202 is the first Interface PCB (IPCB) 302. The first IPCB 302 has a connector 312 that corresponds in size and capacity as the connector 112 on the PCB 102. The connector 312 of the first IPCB contains a PC card 340 of known functionality (i.e., completely operative), a like model of which is intended to be mated to the PCB 102 under test for ultimate shipment to a customer. The connectors 112, 122, and 312 can contain any PC card or device to interface, for example, an EISA device, an ISA device, an AGP device, as well as magnetic strip cards, MCA (micro channel architecture) cards, miniature cards, NIC (network interface cards), PC card flash RAM, CPUs (central processing units), BIOS chips on a card, smart cards, and any other peripheral connection that may be connected to a PCB connector.

When no vacuum is present, test pins 190 are in a retracted position by the effect of gravity(see FIG. 3a). However, when a vacuum is applied between the vacuum plates 202 and 402, the pressure differential between the ends of probe 192 force the probe 192 to extend (see FIG. 3b) onto test pad 124—thereby establishing an electrical connection. In an alternate embodiment of the present invention, the test pins 190 are spring loaded so that the probe 194 is perpetually forced into an extended position In either embodiment, the test pins 190 connect electrically the array of test pads 124 of the connector 112 of the PCB 102 to the test pads 324 of the connector 312 of the first IPCB 302 such that electrical signals are transmitted and received between the test pads 124 and the test pads 324. Once connected, electrical signals or impulses emanating from the test PC card 340 are transmitted to the PCB 102 under test as if the signals came from an equivalent card inserted into connector 112. Similarly, signals or impulses emanating from the test pads 124 (and by extension connector 112) are transmitted to the test PC card 340.

Similarly, other PC cards can be connected to other connectors on the PCB 102 under test. These other PC cards can be connected to the IPBC 302 and IPCB 502 that contain all of the components necessary (such as CPU(s), system RAM, I/O devices) to form, in conjunction with PCB 102, a complete computer system. This complete computer system becomes the functional tester of the PCB 102 under test. Any "failure" or "fault" in the now-complete computer system can be attributed to the PCB 102 under test because the other components are of known functionality.

Figure 4B:
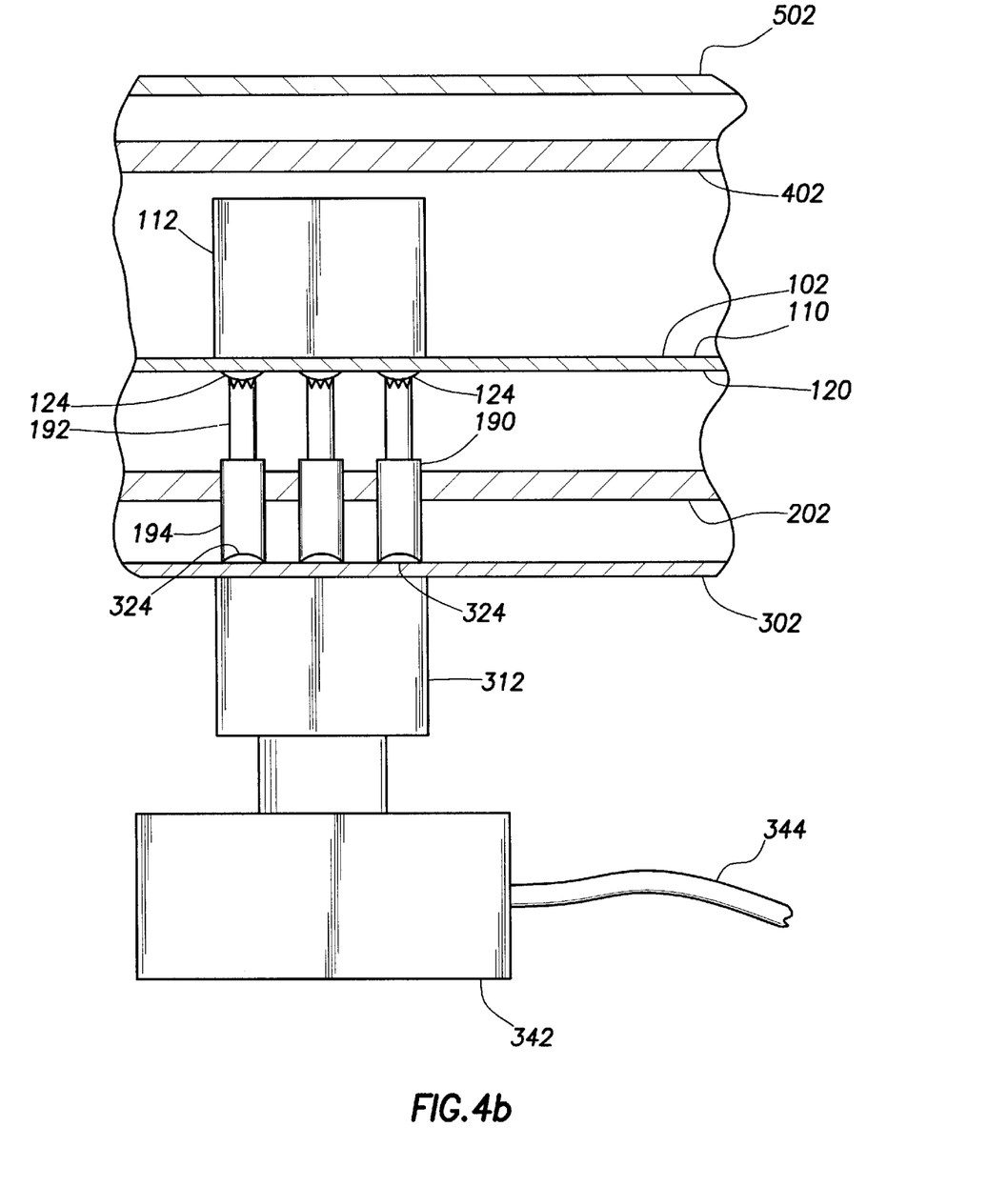
FIG. 4b shows a side view of an alternate embodiment of the present invention illustrating the close coupling between the PCB under test and an interface PCB.

An alternate embodiment of the present invention is shown in FIG. 4b. Referring to FIG. 4b, the difference between the preferred embodiment (see FIG. 4a) and the alternate embodiment is that the daughter PC card 340 is separated from the connector 312 and a bus transceiver and fiber optic transceivers 342 are inserted therebetween. The fiber optic transceivers 342 have a fiber optic cable 344 that is connected to the remote device (not shown) that is capable of processing the signals generated by the transceiver 342. Such a remote device could be a PC card with a second transceiver that is used to communicate with the transceiver 342 via cable 344. The transceiver 342 is further capable of receiving signals from the remote device and generating appropriate signals to the PCB 102 under test via the test pins 190 to simulate the close coupling of a similar device as though that device was connected to connector 112 of the PCB 102 under test. A alternate embodiment with a preferred set of transceivers, is discussed below.

Figure 5:
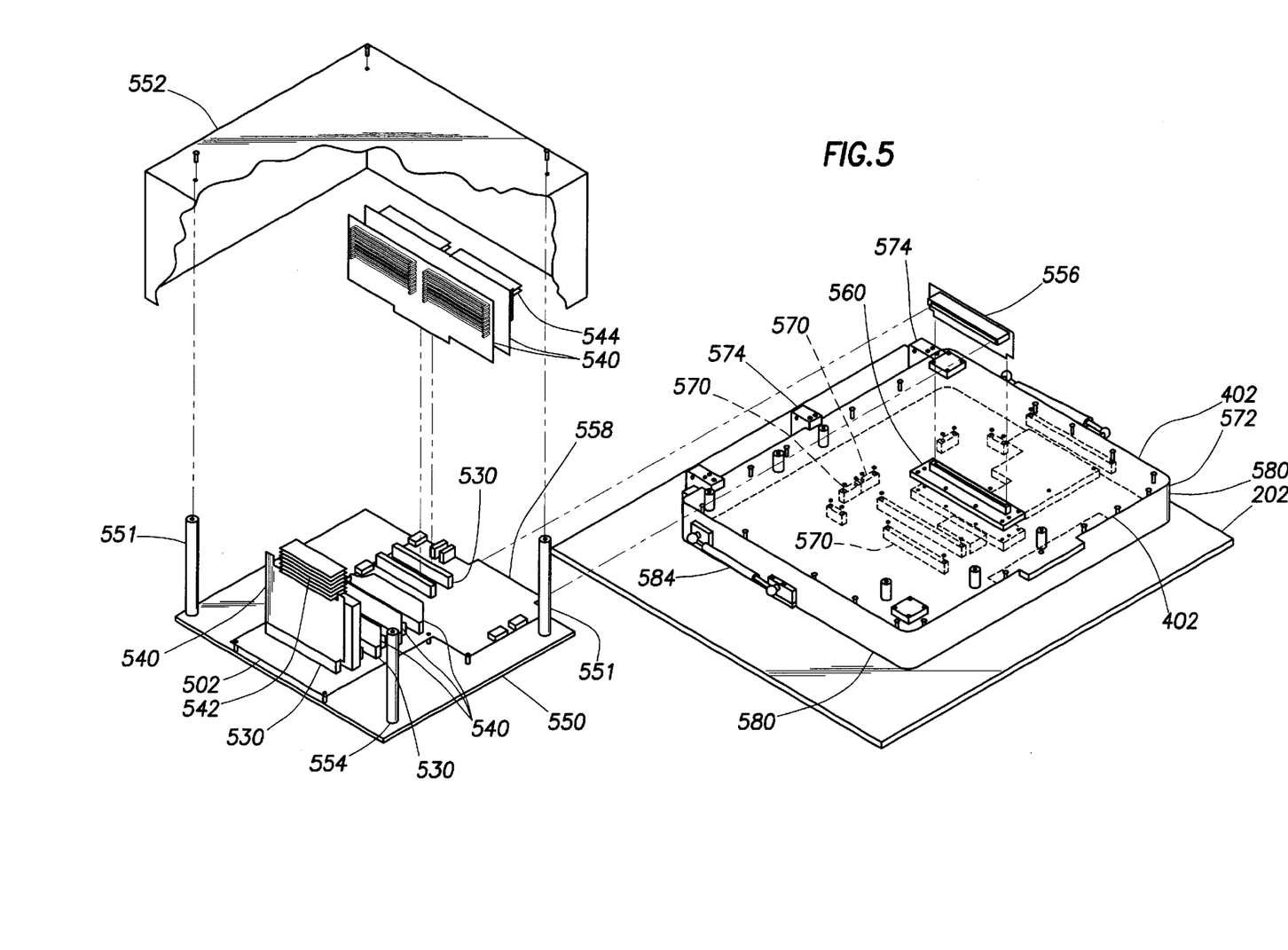
FIG. 5 shows an exploded view of the top interface of the present invention.
Figure 6:
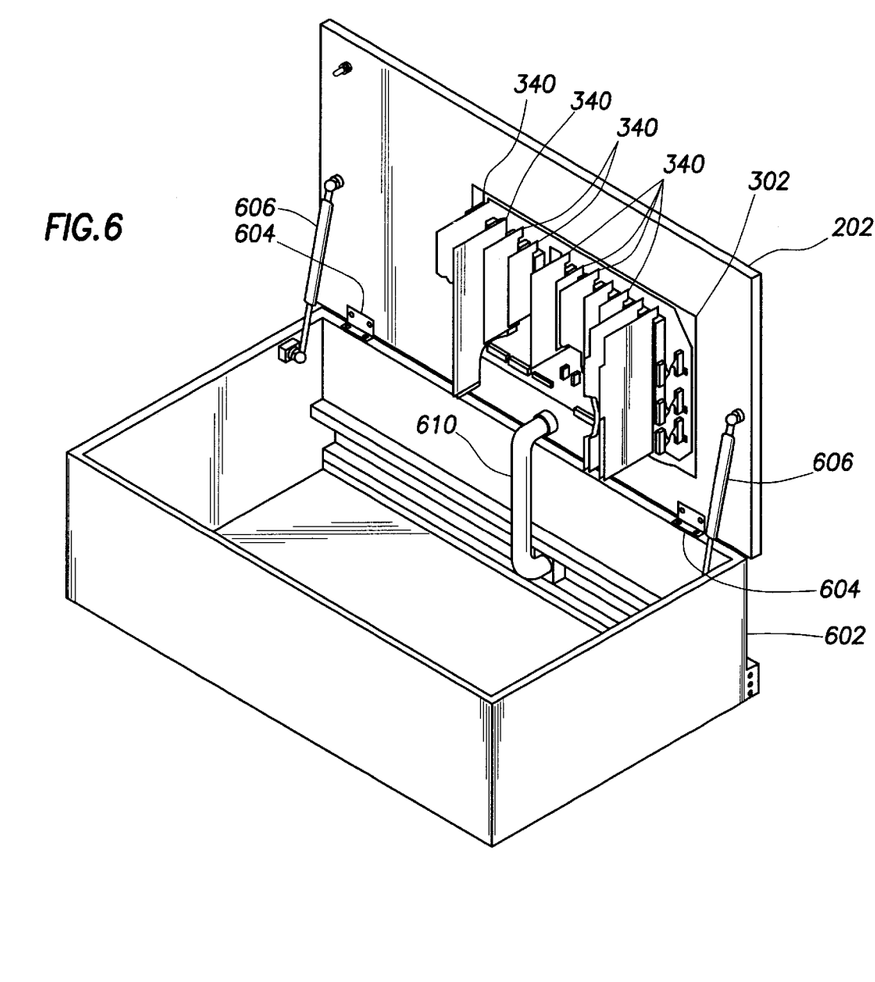
FIG. 6 shows an perspective view of the bottom interface of the present invention in an open position.

The preferred embodiment of the computer system described above can be incorporated into a test stand as shown in FIGS. 5 and 6. The top half of the test system (containing the second (top) IPCB 502) is shown in FIG. 5. As shown in FIG. 5, the second IPCB has an array of connectors 530 into which PC cards 540 are fitted. In the preferred embodiment of the present invention, the leftmost PC card contains multiple central processing units that are cooled with heat-transfer plates 542. The rightmost PC cards 540 contain system RAM 544. All of the PC cards 540 and their connectors 530 are connected electrically (and physically) to IPCB 502. The IPCB 502 can be mounted onto a sturdy platform 550 and enclosed within box 552 which is supported by rods 551 as shown in FIG. 5. Interface tab 558 of IPCB 502 is connected to an elbow connector 556 which, in turn, is connected to the special connector 560. The special connector 560 is connected to a second set of test pins 190 that are used (ultimately) to connect the IPCB 502 to the PCB 102 under test.

The vacuum chamber 572 is formed from the top vacuum plate 402, the bottom vacuum plate 202, and the side ring 580 as shown in FIG. 5. Seals are fitted around and between the plates 202 and 402, as well as the side ring 580 to form an air tight chamber into which the PCB 102 under test is placed. Blocks 570 are attached to the top vacuum plate 402 in order to hold the PCB 102 under test in the correct position and orientation. Hinges 574 are used to attach the side ring 580 and the top vacuum plate 402 to the bottom vacuum plate 202 and enables the former two components to act as a rotatable subassembly that can be raised and lowered to allow swapping of various PCBs 102. Extendable legs 584 are fitted onto the side ring 580 and the bottom vacuum plate 402 to keep the top subassembly in an open position as an aid to the operator. The mounting platform 550 is attached to the top vacuum plate 402.

FIG. 6 shows the bottom half of the test fixture of the present invention in an open position. The bottom vacuum plate 202 is rotatably attached to box 602 by hinges 604. Extendable legs 604 are used to prop the vacuum plate 202 in an open position as shown in FIG. 6. Vacuum tube 610, connected to a vacuum source (not shown), is used to evacuate the test chamber during testing.

The bottom interface to the PCB 102 under test is IPCB board 302 that is attached to the bottom side of the bottom vacuum plate 202 as shown in FIG. 6. FIG. 6 also shows the bottom side of IPCB 302, including the numerous connectors 312 and associated PC cards 340. The rotatable arrangement of the bottom vacuum plate 202 allows for easy access to these test PC cards 340 so that one or more of the cards can be replaced easily. This enables the test fixture of the present invention to test various configurations of computer systems quickly and easily.

During operation, the lower vacuum plate 202 is placed in the close position and the upper assembly is put in the open position. A test PCB 102 is placed onto the top side of the lower vacuum plate 202 and is oriented so that the arrays of test pads on the bottom side 120 of the PCB 102 are aligned with the various sets of test pins 190. The upper assembly is then closed and the vacuum is created by opening a valve (not shown) near the vacuum chamber. As mentioned before, various blocks 570 attached to the top vacuum plate 402 help to maintain the position and orientation of the PCB 102 under test. Once the vacuum is created, the test pins 190 extend to connect the PCB 102 under test to both the top IPCB 502 and the bottom IPCB 302 (as shown in FIG. 4a). With all of the electrical connections established, the CPU(s) on the PC cards 540 can be booted and the computer system of the present invention, with PCB 102 as an integral part, can be tested in realistic conditions with latencies approaching those of actual systems.

In alternate embodiments of the present invention, the various connectors 312 and 530 are replaced with transceivers. The transceivers can be radio frequency transceivers, such as microwave transceivers, infra red transceivers, fiber optic transceivers and the like, or any combination thereof. These transceivers can form a parallel link and/or a serial link to the PCB 102 under test. Transceivers can be utilized in this alternate embodiment because the signal latency of high frequency and optical transceivers are so low. Transceivers also enable the various PC cards to be placed farther away from the PCB 102 under test. Finally, transceivers also enable the various PC cards to be replaced with a link to another computer system. This alternate embodiment not only allows testing of a PCB 102, it also enables testing the characteristics of proposed PC cards that are not yet built. In this latter scenario, the proposed PC cards can be tested vis-a-vis existing PCBs by utilizing a mathematical model that is digitized on another computer system that is linked to the test fixture and the PCB 102 via a transceiver. In this way, "virtual" PC cards can be tested for compatibility against existing equipment for simulated functional testing.

Figure 7:
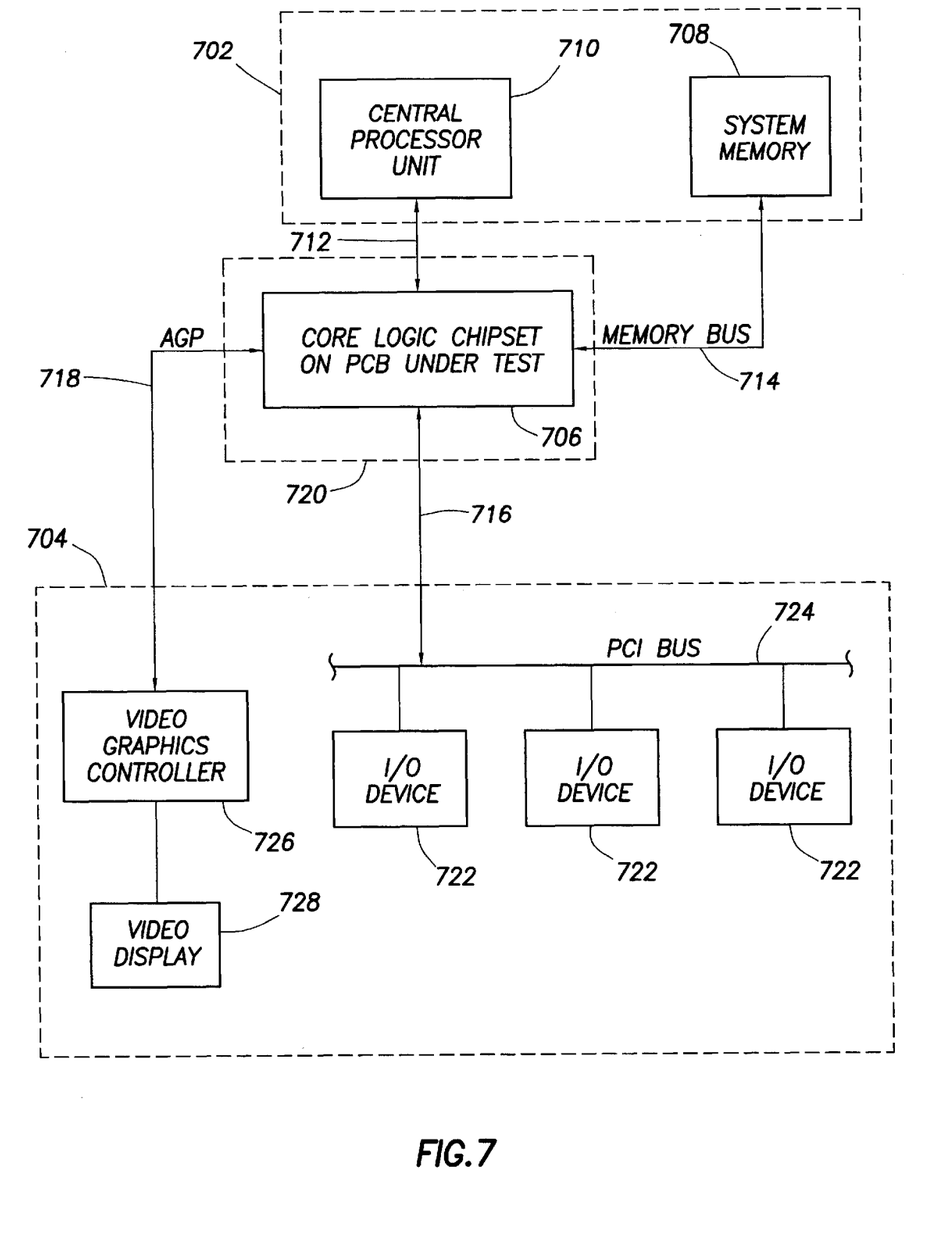
FIG. 7 shows a schematic diagram of the complete computer system according to the present invention.
Figure 8:
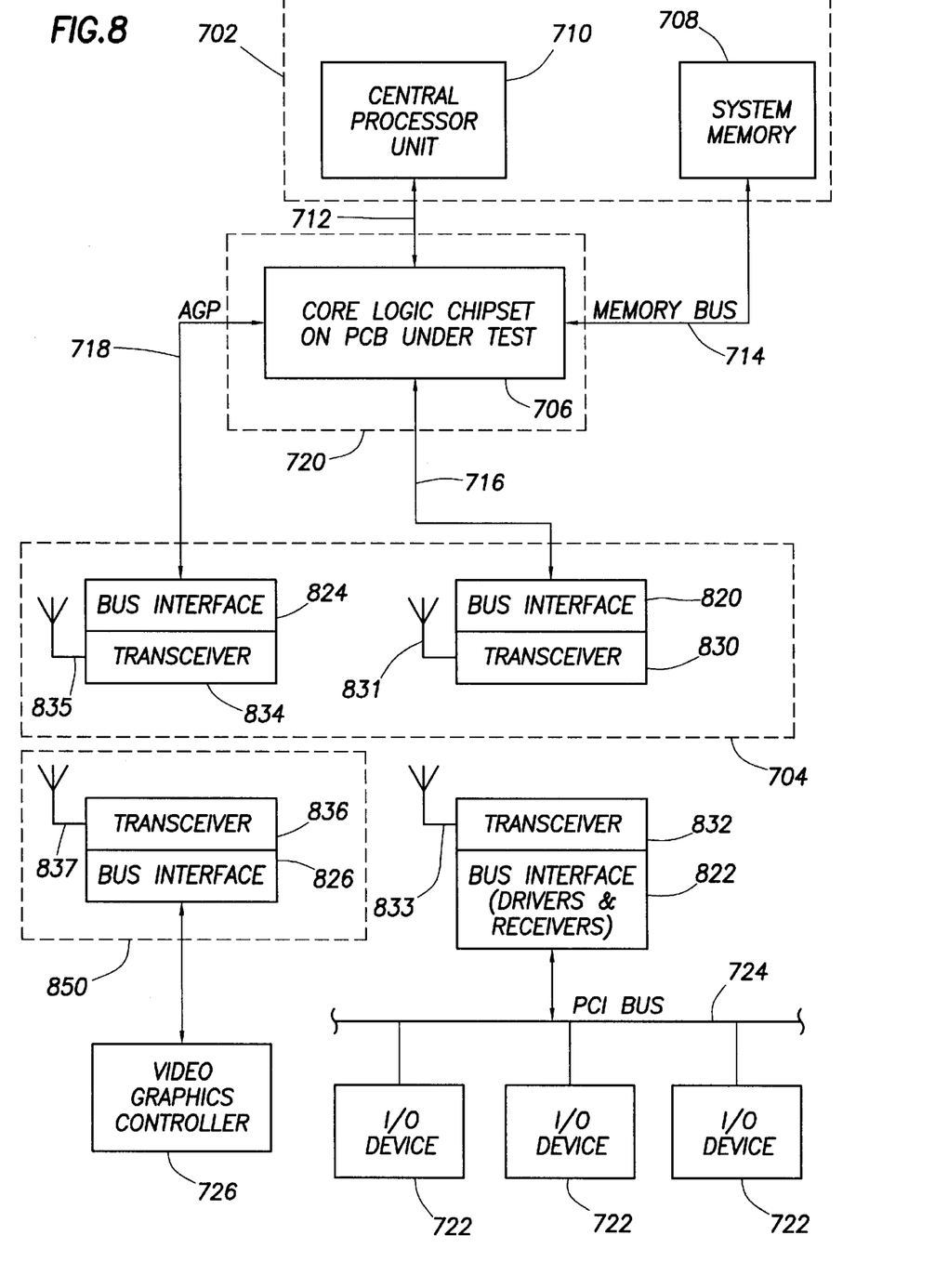
FIG. 8 shows a schematic diagram of a complete computer system that is an alternate embodiment of the present invention.

FIGS. 7 and 8 show a schematic diagram of the computer system of the present invention. Referring to FIG. 7, the PCB under test 7 is shown in the center of the schematic drawing. A core logic chipset 706 is incorporated into the PCB 720. The top IPCB 702 has a central processing unit (CPU) 710 and system memory 708. The test pin connection scheme 712 and 714 is used to connect the CPU 710 and the system memory 708 to the PCB 720, respectively. Similarly, the test pin connection scheme 718 and 716 are used to connect the PCB 720 under test to the bottom IPCB 704 which contains the video graphics controller 726 (and the video display 728) and the PCI bus 724, respectively. In this manner, the CPU 710 can access the I/O devices 722 and 728 via the PCB 720 under test.

FIG. 8 shows a schematic of an alternate embodiment computer system of the present invention. As with the preferred embodiment, the top IPCB 702 is coupled to the PCB 720 under test via test pin sets 712 and 714, thereby connecting the CPU 710 and the system memory 708 to the core logic chipset 706. The test pins 718 and 176 connect the PCB 720 to the IPCB 704 as shown in FIG. 8. However, unlike the preferred embodiment, the bottom IPCB has bus interfaces 824 and 820 (containing drivers and receivers) to transceivers 834 and 830, respectively. Transceivers 830 and 834 have antennae 831 and 835, respectively. The combination of the bus interface, the transceiver, and the antenna creates a virtual connector.

In the alternate embodiment shown in FIG. 8, the PC cards that had been located on the bottom IPCB in the preferred embodiment are now located remotely as shown in FIG. 8. In this embodiment, the video graphics controller has a transceiver 836 with antenna 837 that are connected to the bus interface 826. Similarly, the PCI bus 724 is directly connected the bus interface 822 which, in turn, is connected to the transceiver 832 and the antenna 833. The transceivers 836 and 832 communicate, via their respective antennae, to the transceivers 834 and 830, respectively. Consequently, the connections between, for example, video graphics controller 726 and the core logic chipset 706 can best be described as "virtual." The transceiver 836, antenna 837 and the bus interface 826 form a virtual connector 850 as shown in FIG. 8. This virtual connector communicates with its counterpart on the IPCB 704 through any number of mediums, such as optically (e.g., infra red or fiber optics), or electromagnetically (such as by radio waves, magnetism, or other telemetry). In yet another alternate embodiment of the present invention, the transceiver 850, for example, can be multiplexed to allow, for example, video graphics controller 726 to service several test fixtures simultaneously.

Figure 9:
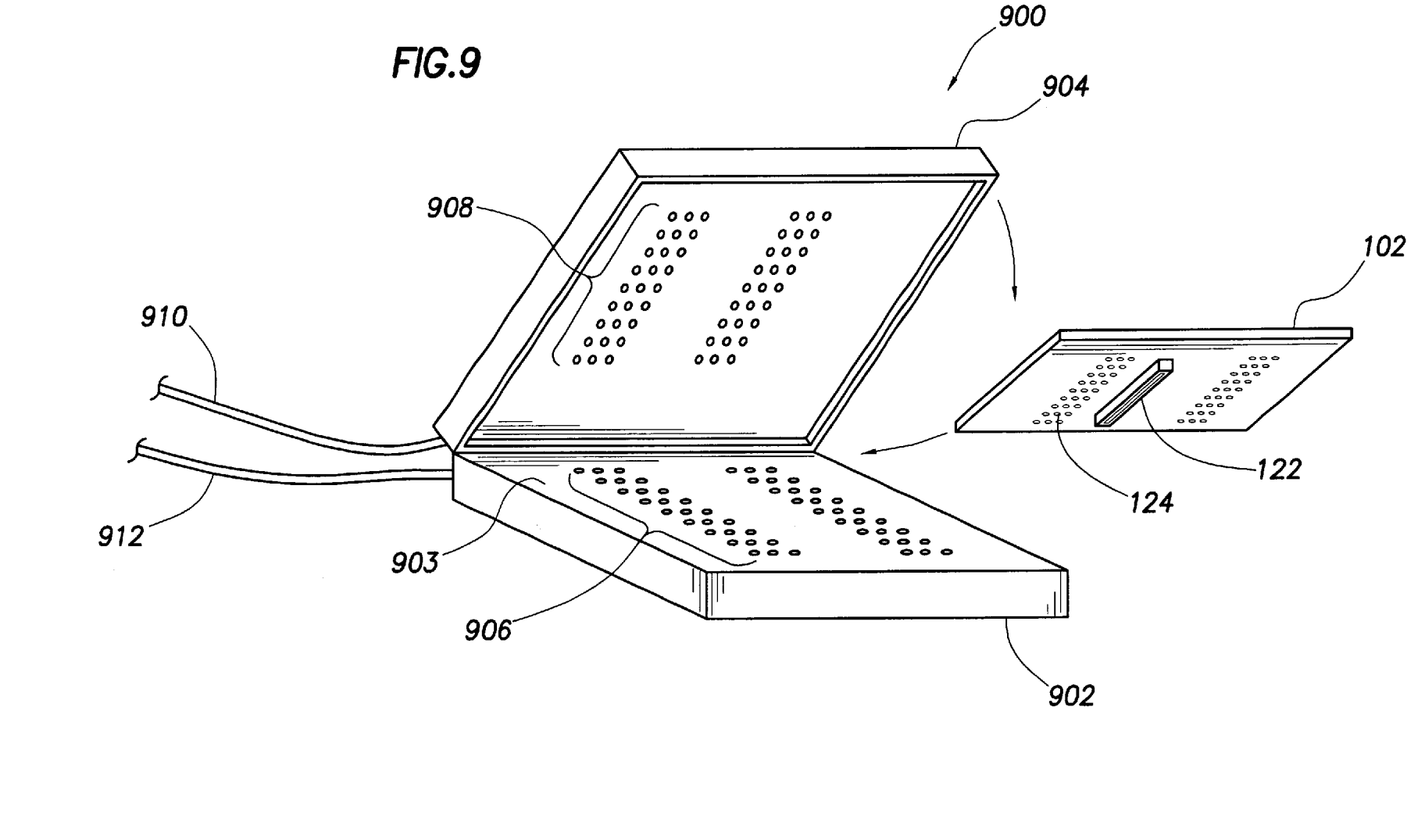
FIG. 9 shows a perspective view of an alternate embodiment of the present invention.

Yet another alternate embodiment 900 of the present invention is illustrated in FIG. 9. In this alternate embodiment, the fiber optic transceivers (see FIG. 4b) are utilized on both the top IPCB 904 and the bottom IPCB 902 to enable the size and weight of the test fixture to be reduced substantially. In fact, the size of the test fixture need be only a few inches thick and not much larger in area than the PCB 102 under test. Fiber optic cables 910 and 912 connect the top IPCB 904 and the bottom IPCB 902, respectively, to other test computer system components (not shown).

In operation, the hinged top IPCB 904 is opened to reveal the test chamber 903 as shown in FIG. 9. The set of test pads 124 on the PCB 102 under test are then positioned over the set of test pins 906. Other sets of test pads on the PCB 102 under test are similarly arranged vis-a-vis other sets of test pins, such as set 908. Once oriented correctly, the top IPCB 904 is closed and an air tight seal is established with the bottom IPCB 902. A flexible hose (not shown) is attached to the test fixture 900 and a valve is opened to create a vacuum within test chamber 903, thereby causing the various test pins to engage electrically with PCB 102 under test. Signals from remote devices (not shown) can then be transmitted to the test fixture 900 to first test that the proper electrical connections have been established, and then to test the response and quality of the PCB 102 under test.

Figure 10:
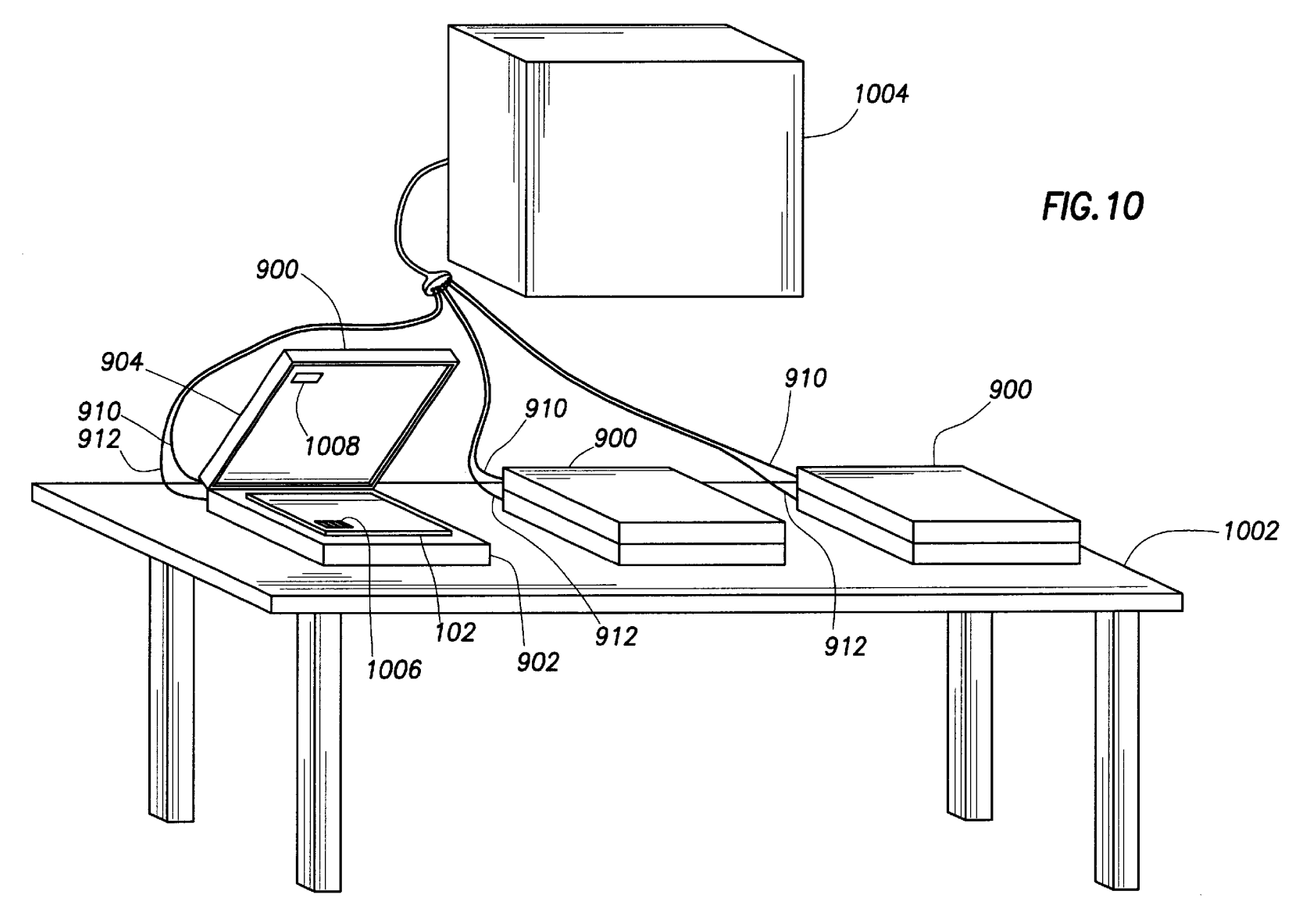
FIG. 10 shows a perspective view of a test jig utilizing the alternate embodiment of the present invention.

FIG. 10 illustrates the newfound capability of the alternate embodiment 900. A series of test chambers 900 can be laid onto a convenient table 1002. The fiber optic cables 910 and 912 are connected to a test machine 1004 containing a central processing unit and other PC cards for which the PCB 102 under test is designed to operate. The test machine 1004 contains transceivers that can communicate with the fiber optic transceivers contained within the IPCB 902 and IPCB 904 and thereby communicate with the PCB 102 under test. The sequential arrangement of test fixtures as illustrated in FIG. 10, and the multiplexing of transceiver signals to test machine 1004, enables a single operator to test multiple PCBs 102 simultaneously. For example, the operator merely needs to place and orient a PCB 102 in a test fixture 900, close the lid, and move to the next test fixture 900. Once closed, the test machine 1004 tests for the establishment of proper electrical connections and, if established, immediately proceeds to test the PCB 102. In the meantime, the operator is placing new PCBs into other test fixtures 900 or is removing tested PCBs from still other test fixtures 900. The tests fixture 900 could also be fitted with a bar code reader 1008 that can read a bar code 1006 on the PCB 102 under test and inform the manufacturing computer system of the results of the test—independent of the human operator. An audible signal may be issued to the human operator indicating that the PCB 102 under test has either passed or failed the test and to dispose of the PCB 102 accordingly. In addition to, or in lieu of, an audible signal, a visual marking, such as a paint or ink spot, can be placed automatically at a prearranged location on the PCB 102 to provide a visual indication of the results of the test.

The present invention, therefore, is well adapted to carry out the objects and attain the ends and advantages mentioned, as well as others inherent therein. While the present invention has been depicted, described, and is defined by reference to particular preferred embodiments of the invention, such references do not imply a limitation on the invention, and no such limitation is to be inferred. The invention is capable of considerable modification, alternation, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A computer system having a dual access functional fixture for electrically interfacing a first side and a second side of a PCB under test, said fixture comprising:
   a first interface for electrically interfacing said fixture with a first set of test pads on said first side of said PCB under test, said first interface comprising:
      a first interface PCB, said first interface PCB having a first connector, said first connector having a first set of connection points having a one-to-one correspondence to a first set of test pads on said first side of said PCB under test;
      first test card inserted into said first connector; and
      first set of test pins, said first set of test pins constructed and arranged to connect electrically said first set of test pads on said first side of said PCB under test to said first set of connection points on said first interface PCB;
   a second interface for electrically interfacing said fixture with a second set of test pads on said second side of said PCB under test, said second interface comprising:
      a second interface PCB, said second interface PCB having a second connector, said second connector having a second set of connection points having a one-to-one correspondence to a second set of test pads on said second side of said PCB under test;
      a second test card inserted into said second connector; and
      a second set of test pins, said second set of test pins constructed and arranged to connect electrically said second set of test pads on said second side of said PCB under test to said second set of connection points on said second interface PCB;
   wherein when said fixture is interfaced with said PCB wider test, a complete computer system is formed so that said computer system may be functionally tested.

2. A computer system as in claim 1 wherein said first test card is closely coupled to said PCB under test.

3. A computer system as in claim 1 wherein said second test card is closely coupled to said PCB under test.

4. A computer system as in claim 1 wherein said first test card is an input-output card.

5. A computer system as in claim 4 wherein said first test card is a PCI card.

6. A computer system as in claim 1 wherein said second card contains at least one central processing unit.

7. A computer system as in claim 1 wherein said interface is established through the use of a vacuum.

8. A computer system having a dual-access functional fixture for electrically interfacing a first side and a second side of a PCB under test, said fixture comprising:
   a first interface for electrically interfacing said fixture with a first set of test pads on said first side of said PCB under test, said first interface comprising:
      a first primary test card and a second primary test card;
      a first interface PCB, said first interface PCB having a first connector, said first connector having a first set of connection points having a one-to-one correspondence to a first set of test pads on said first side of said PCB under test, said connector further having a selector, said selector capable of connecting said first connector to said first primary test card or to said second primary test card; and
      a first set of test pins, said first set of test pins constructed and arranged to connect electrically said first set of test pads on said first side of said PCB under test to said first set of connection points on said first interface PCB;
   a second interface for electrically interfacing said fixture with a second set of test pads on said second side of said PCB under test, said second interface comprising:
      a first secondary test card and a second secondary test card;
      a second interface PCB, said second interface PCB having a second connector, said second connector having a second set of connection points having a one-to-one correspondence to a second set of test pads on said second side of said PCB under test, said connector further having a selector, said selector capable of connecting said second connector to said first secondary test card or to said second secondary test card; and
      a second set of test pins, said second set of test pins constructed and arranged to connect electrically said second set of test pads on said second side of said PCB under test to said second set of connection points on said second interface PCB;
   wherein when said fixture is interfaced with said PCB under test, a complete computer system is formed so that said computer system may be functionally tested with a variety of test cards without disassembly or re-assembly.

9. A computer system as in claim 8 wherein said primary test cards are closely coupled to said PCB under test.

10. A computer system as in claim 8 wherein said secondary test cards are closely coupled to said PCB under test.

11. A computer system as in claim 8 wherein said primary test cards are an input-output cards.

12. A computer system as in claim 8 wherein said secondary cards contain at least one central processing unit.

13. A computer system as in claim 8 wherein said interface is established through the use of a vacuum.

14. A computer system having a dual-access functional fixture for electrically interfacing a first side and a second side of a PCB under test, said fixture comprising:
   a first interface for electrically interfacing said fixture with a first set of test pads on said first side of said PCB under test, said first interface comprising:
      a first interface PCB, said first interface PCB having a first transceiver, said first transceiver having a first set of connection points having a one-to-one correspondence to a first set of test pads on said first side of said PCB under test;
      a first test item inserted into said first transceiver; and
      a first set of test pins, said first set of test pins constructed and arranged to connect electrically said first set of test pads on said first side of said PCB under test to said first set of connection points on said first interface PCB;
   a second interface for electrically interfacing said fixture with a second set of test pads on said second side of said PCB under test, said second interface comprising:
      a second interface PCB, said second interface PCB having a second transceiver, said second transceiver having a second set of connection points having a one-to-one correspondence to a second set of test pads on said second side of said PCB under test;

a second test item inserted into said second transceiver; and a second set of test pins, said second set of test pins constructed and arranged to connect electrically said second set of test pads on said second side of said PCB under test to said second set of connection points on said second interface PCB;

wherein when said fixture is interfaced with said PCB under test, a complete computer system is formed so that said computer system may be functionally tested.

15. A computer system as in claim 14 wherein said first item is a card.

16. A computer system as in claim 14 wherein said first item is another computer system.

17. A computer system as in claim 14 wherein said transceiver is a fiber optic transceiver.

18. A computer system as in claim 14 wherein said transceiver forms a serial link.

19. A computer system as in claim 14 wherein said transceiver forms a parallel link.

20. A computer system as in claim 14 wherein said transceiver is a radio frequency transceiver.

21. A computer system as in claim 14 wherein said transceiver is a microwave transceiver.

22. A computer system as in claim 14 wherein said transceiver is an infrared transceiver.

23. A computer system as in claim 14, said computer system having a central processing unit, said central processing unit remaining booted during the removal and replacement of said PCB under test.

24. A computer system as in claim 14 wherein said transceivers are multiplex transceivers that enables a single central processing unit to test at least two of said PCB under test in separate test fixtures.

* * * * *